(12) United States Patent
Wang et al.

(10) Patent No.: US 12,489,065 B2
(45) Date of Patent: Dec. 2, 2025

(54) FABRICATION METHOD OF SEMICONDUCTOR STRUCTURE

(71) Applicant: TAIWAN SEMICONDUCTOR MANUFACTURING COMPANY, LTD., Hsinchu (TW)

(72) Inventors: Chin-Shan Wang, Hsinchu (TW); Shun-Yi Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 922 days.

(21) Appl. No.: 17/338,292

(22) Filed: Jun. 3, 2021

(65) Prior Publication Data

US 2021/0296257 A1   Sep. 23, 2021

Related U.S. Application Data

(60) Continuation of application No. 16/222,355, filed on Dec. 17, 2018, now Pat. No. 11,270,952, which is a division of application No. 15/255,350, filed on Sep. 2, 2016, now Pat. No. 10,157,856.

(60) Provisional application No. 62/343,535, filed on May 31, 2016.

(51) Int. Cl.
  *H01L 23/552*  (2006.01)
  *H01L 21/762*  (2006.01)
  *H01L 23/58*  (2006.01)

(52) U.S. Cl.
  CPC ...... *H01L 23/552* (2013.01); *H01L 21/76224* (2013.01); *H01L 23/585* (2013.01)

(58) Field of Classification Search
  CPC ............ H01L 23/552; H01L 21/76224; H01L 23/585; H01L 21/76801; H01L 21/76802; H01L 21/76877
  See application file for complete search history.

(56) References Cited

U.S. PATENT DOCUMENTS

| | | | |
|---|---|---|---|
| 2002/0125577 A1 | 9/2002 | Komada | |
| 2006/0151875 A1 | 7/2006 | Lin et al. | |
| 2006/0223279 A1 | 10/2006 | Patraw et al. | |
| 2008/0073747 A1* | 3/2008 | Chao | H01L 25/0657 257/E21.628 |
| 2009/0127652 A1* | 5/2009 | Ding | H01L 21/76264 257/E23.114 |
| 2010/0038705 A1* | 2/2010 | Doris | H01L 21/28026 438/303 |
| 2011/0057297 A1* | 3/2011 | Lee | H01L 23/585 257/E23.179 |
| 2011/0227162 A1 | 9/2011 | Lin et al. | |
| 2012/0313217 A1 | 12/2012 | Hung et al. | |

(Continued)

FOREIGN PATENT DOCUMENTS

| | | |
|---|---|---|
| TW | 201501294 | 1/2015 |
| TW | 201535729 | 9/2015 |

*Primary Examiner* — Mohammed R Alam
(74) *Attorney, Agent, or Firm* — Hauptman Ham, LLP

(57) ABSTRACT

A method includes forming parallel first and second dummy materials in an alternating manner. The method further includes etching portions of the first and second dummy materials, using respective selective etches, to form a plurality of gaps. The method further includes filling a first gap of the plurality of gaps with a dielectric material. The method further includes filling a second gap of the plurality of gaps with a conductive material.

20 Claims, 8 Drawing Sheets

(56) References Cited

U.S. PATENT DOCUMENTS

| | | |
|---|---|---|
| 2013/0140639 A1 | 6/2013 | Shieh et al. |
| 2014/0239455 A1 | 8/2014 | Ishii |
| 2015/0349050 A1 | 12/2015 | Fang |
| 2015/0364419 A1 | 12/2015 | Tran et al. |
| 2016/0064506 A1* | 3/2016 | Zhou ................. H01L 29/66545 257/410 |
| 2016/0190021 A1 | 6/2016 | Liu et al. |
| 2016/0380052 A1 | 12/2016 | Kim et al. |
| 2017/0194230 A1 | 7/2017 | Prechtl et al. |
| 2017/0271470 A1* | 9/2017 | Le Royer .............. H01L 29/517 |
| 2017/0330896 A1 | 11/2017 | See et al. |

* cited by examiner

FABRICATION METHOD OF SEMICONDUCTOR STRUCTURE

PRIORITY CLAIM

The present application is a continuation of U.S. application Ser. No. 16/222,355, filed Dec. 17, 2018, now U.S. Pat. No. 11,270,952, issued Mar. 8, 2022, which is a divisional of U.S. application Ser. No. 15/255,350, filed Sep. 2, 2016, now U.S. Pat. No. 10,157,856 issued Dec. 18, 2018, which claims the priority of U.S. Provisional Application No. 62/343,535, filed May 31, 2016, which are incorporated herein by reference in their entireties.

RELATED APPLICATION

The instant application is related U.S. patent application Ser. No. 15/178,903, filed Jun. 10, 2016, and titled "SEMICONDUCTOR DEVICE AND FABRICATION METHOD THEREFOR," the entire content of which is incorporated by reference herein.

BACKGROUND

In a semiconductor process, a plurality of dies, each of which contains an integrated circuit (IC), are fabricated on a wafer at the same time. A seal ring, also called a guard ring, is located between the integrated circuit and a scribe line to reduce a magnitude of stress on an inner portion of the die during a die-sawing process along the scribe line. The seal ring also serves as a barrier for protecting semiconductor structures of the inner portion of the die from moisture degradation, ionic contamination, and electrostatic discharge damage.

In some approaches, the seal ring is formed of interconnected metal lines and vias, connected to a doped substrate. In some approaches, multiple seal rings are fabricated to help ensure stability of properties of semiconductor devices for a longer time period. In some approaches, a lateral opening is formed in the seal ring to cut a path for coupling noise in the seal ring which negatively impacts performance of the IC in the die.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of various features in the drawings may be arbitrarily increased or reduced for clarity of discussion.

DETAILED DESCRIPTION

Figure 1:
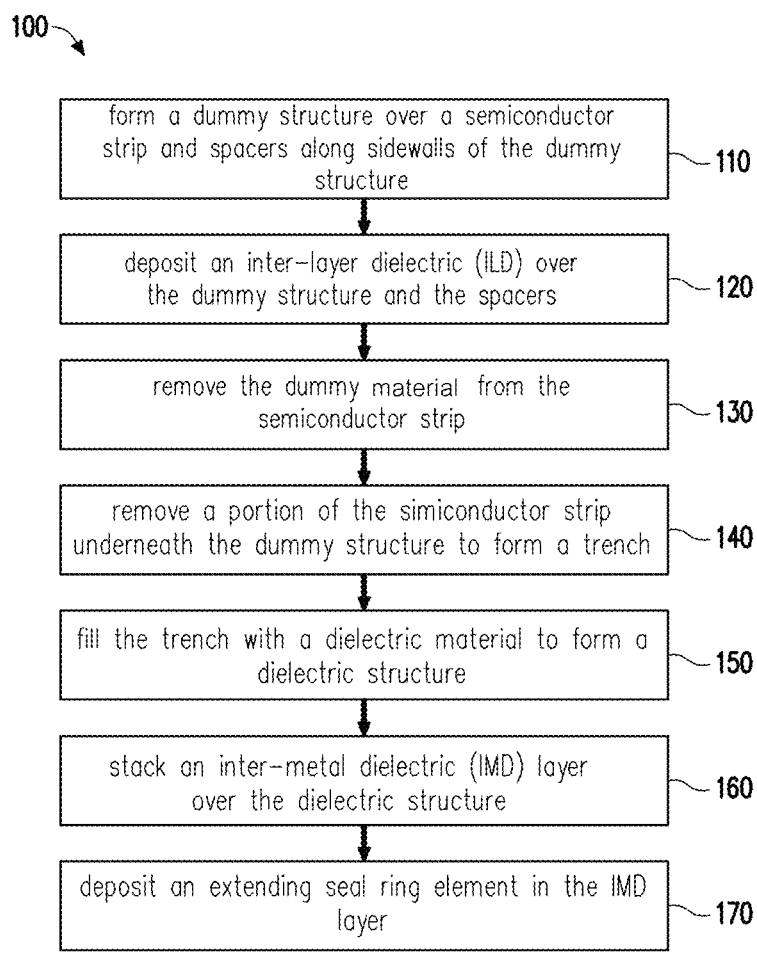
FIG. 1 is a flowchart of a method of fabricating a semiconductor device including a seal ring in accordance with one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A seal ring is formed along a perimeter of an integrated circuit (IC) during fabrication of layers of the IC, including a front end of line (FEoL) process and a back end of line (BEoL) process. The semiconductor industry has experienced continuous rapid growth due to constant improvements in the integration density of various electronic components. Due to the scaling down of geometries in advanced technologies, interconnects in FEoL processes are placed in increasingly closer proximity and higher density, resulting in an increased coupling effect between the seal ring and the IC. The increased coupling effect results in significant noise increases, signal delays, logic errors, and even IC malfunctions. Isolation of the seal ring helps to prevent a noise coupling path for the coupling effect, thereby improving the IC performance.

In some approaches, a continuous poly on oxide definition edge (CPODE) pattern or a poly on oxide definition edge (PODE) pattern is used to form a trench by removing a dummy material and a portion of a semiconductor body and even a portion of an insulating feature under the dummy material. In at least one example, the term "oxide definition" defines an active region located adjacent to insulating features. The seal ring formed by the CPODE pattern occupies a reduced area in a chip while having a reduced coupling effect in comparison with other approaches. A dielectric structure is formed by filling the trench with a dielectric material. No extra mask is needed for the CPODE pattern or the PODE pattern. In some embodiments, the dielectric structure is formed simultaneously with forming other CPODE structures in other portions of the device, such as a capacitor. Forming the dielectric structure simultaneously with forming other CPODE structures helps to avoid a need for additional masks and reduces production costs.

The dielectric structure is formed in a seal ring area between a circuit area and a scribe line. In some embodiments, the dielectric structure is aligned with a middle line between two abutted well regions or two abutted standard cells. In some embodiments, the dielectric structure is located between two edge dummy structures. By using the dielectric structure, the coupling effect is reduced in comparison with other approaches because the noise coupling path is cut due to a non-conductive material. Manufacturing quality is maintained because the seal ring still provides an adequate protective function, preventing moisture penetration, ionic contamination, and stress generated during the dicing procedure.

FIG. 1 is a flowchart of a method 100 of fabricating a semiconductor device including a seal ring in accordance with one or more embodiments. Method 100 includes operation 110 in which a dummy structure is formed over a semiconductor strip and spacers are formed along sidewalls of the dummy structure. In some instances, the dummy structure is called a sacrificial gate structure. The dummy structure includes a dummy material. The semiconductor strip, also called a semiconductor fin, extends from a substrate. In some instances, the dummy structure is formed directly on a top surface of the substrate. In some instances, the dummy structure is formed on an edge of a well region. In at least one example, the dummy structure is formed on an edge of an active region.

The spacers are on the top surface of the semiconductor strip. The spacers adjoin sidewalls of the dummy structure. In some embodiments, the spacers include silicon oxide, silicon nitride, or another suitable material. For example, the spacers include an oxide-nitride-oxide (ONO) structure in some embodiments.

Figure 2A:
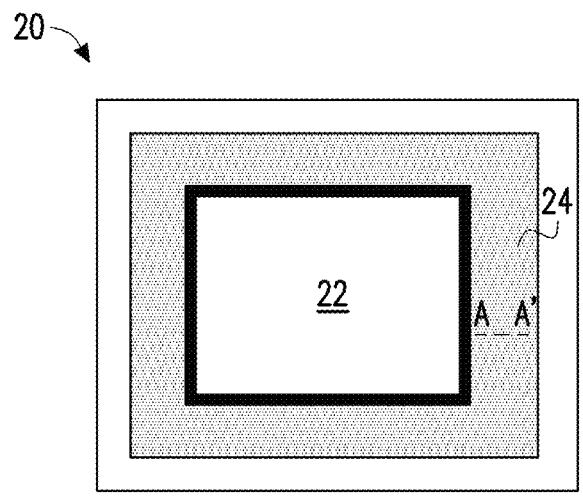
FIG. 2A is a schematic plan view of a semiconductor chip having a seal ring in accordance with one or more embodiments.

FIG. 2A is a schematic plan view of a semiconductor device having a seal ring in accordance with one or more embodiments. Chip 20 has a circuit area 22 and a seal ring area 24. Circuit area 22 and seal ring area 24 share a common workpiece, i.e., a substrate. Seal ring area 24 is adjacent to edges of circuit area 22. Integrated circuits are formed in circuit area 22 and on an inner side of seal ring area 24. A scribe line (not shown) is on an exterior of seal ring area 24.

FIGS. 2B to 2F are schematic cross-sectional views taken along line A-A' in FIG. 2A at various stages of fabrication in accordance with one or more embodiments.

Figure 2B:
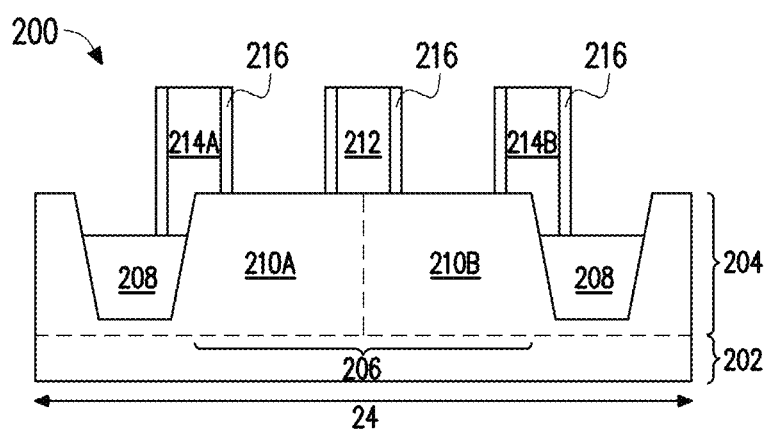
FIGS. 2B-2F are cross-sectional views taken along line A-A' in FIG. 2A at various stages of fabrication in accordance with one or more embodiments.

FIG. 2B is a cross-sectional view of a semiconductor device 200 following operation 110 in accordance with one or more embodiments. Semiconductor device 200 is in seal ring area 24. In some embodiments, semiconductor device 200 includes a substrate 202 and a semiconductor strip 204. Semiconductor strip 204 extends from substrate 202. In some embodiments, substrate 202 is free of semiconductor strip 204 and therefore has a planar top surface. In at least one embodiment, substrate 202 is a silicon substrate. In some embodiments, substrate 202 is a silicon on insulator layer (SOI) substrate, or a silicon on sapphire (SOS) substrate. Substrate 202 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, substrate 202 and semiconductor strip 204 are made of a same material. In some embodiments, substrate 202 and semiconductor strip 204 are made of different materials.

Substrate 202 includes an active region 206 and insulating features 208. In some embodiments, insulating features 208 are called isolation features or inactive regions. The insulating features are shallow trench isolation (STI), field oxide (FOX), or other suitable electrically insulating structures. Insulating features 208 electrically isolate active region 206 from other areas of semiconductor strip 204. In at least one example, the formation of insulating regions 208 includes a photolithography process, an etch process to form trenches in semiconductor strip 204 or substrate 202, and a deposition process to fill the trenches with one or more dielectric materials. In some embodiments, the formation of insulating features 208 includes another STI procedure or local oxidation of silicon (LOCOS).

Active region 206 is between insulating features 208 in a first direction. Semiconductor strip 204 is between insulating features 208 in a second direction perpendicular to a plane including the first direction. An upper portion of semiconductor strip 204 protrudes above insulating features 208. In some embodiments, when substrate 202 is free of semiconductor strip 204, insulating features 208 is in substrate 202 and a top surface of insulating features 208 is substantially coplanar with a top surface of substrate 202 . . . . In some embodiments, active region 206 includes a first well region 210A and a second well region 210B disposed in semiconductor strip 204 or substrate 202 and adjacent to insulating features 208. The formation of the well regions 210A and 210B includes an implantation process. In some embodiments, active region 206 includes a single well region. In some embodiments, active region 206 is free of any well region. Dummy structures 212, 214A and 214B are on a top surface of semiconductor strip 204. In some instances, dummy structures 212, 214A and 214B are on the top surface of substrate 202 when substrate 202 is free of semiconductor strip 204. Dummy structures 212, 214A and 214B are also called dummy gate structures, in some instances. Dummy structures 212, 214A and 214B are at least partially on active region 206. Dummy structure 212 is completely on active region 206. Dummy structures 214A and 214B are partially on active region 206 and partially on insulating features 208. In some embodiments, dummy structures 214A and 214B are completely on insulating features 208. In some embodiments, dummy structures 214A and 214B are completely on active region 206. When active region 206 includes the first well region 210A and the second well region 210B, dummy structure 212 substantially aligns with a middle line at an interface of the first well region 210A and the second well region 210B. Spacers 216 are along sidewalls of each of dummy structures 212, 214A and 214B.

In some embodiments, semiconductor device 200 includes more dummy structures other than dummy structures 212, 214A and 214B, such as a dummy structure (not shown) completely on insulating features 208. Dummy structure 212 is between dummy structures 214A and 214B. In some embodiments, one or more dummy structures are between dummy structure 212 and dummy structures 214A and 214B. Such additional dummy structures are replaced with a gate electrode in subsequent processes, in some embodiments. In some embodiments, dummy structures 214A and 214B are replaceable to form edge gate structures, e.g., in a gate-last methodology. In some embodiments, dummy structures 214A and 214B do not function as a gate electrode, but are used to protect an edge of a transistor. Because dummy structures 214A and 214B are formed on an edge of active region 206 or an edge of a cell, dummy structures 214A and 214B correspond to a poly-on-diffusion-edge (PODE) pattern. Because dummy structure 212 is formed on a connected edge of two well regions or a common edge of two cells, dummy structure 212 corresponds to a continuous poly-on-diffusion-edge (CPODE) pattern. For example, dummy structure 212 is on first well region 210A and second well region 210B and aligned with a middle line of the two abutted well regions. In some embodiments, dummy structure 212 is offset from the middle line of first region 210A and second region 210B. In an integrated circuit (IC) layout, the PODE pattern is schematically indicated using a label "PODE" and the CPODE pattern is schematically indicated using a label "CPODE." In some embodiments, PODE and CPODE patterns are formed of a same material, by using a same photomask, such as poly (polysilicon) patterns. In such embodiments, the poly patterns, the PODE patterns, and the CPODE patterns, are formed in a same layer. In some embodiments, the PODE patterns and the CPODE patterns are formed in a same layer, but are formed in a different layer from the poly patterns. In some embodiments, PODE patterns and poly patterns are formed in a same layer, but are formed in a different layer from CPODE patterns. In some embodiments, PODE and CPODE patterns are merged with one or more transistors in a standard cell layout to achieve a higher density and smaller corner variations such as mobility variations caused by process variations for cells placed at different locations on a same chip for chips placed at different locations on a same wafer. Corner variations are the result of non-uniformities in a manufacturing process which result in devices having variations in performance characteristics.

In some embodiments, dummy structures 212, 214A and 214B are formed simultaneously. In a gate-last or "replacement gate" methodology, dummy structures 212, 214A and 214B, also called sacrificial gate structures, are initially formed, various processes associated with semiconductor device 200 are performed, and the dummy materials of dummy structures 212, 214A and 214B are subsequently removed and replaced with one or more materials. In some embodiments, dummy structures 212, 214A and 214B include a gate dielectric and/or a gate electrode.

For example, the gate dielectric is silicon dioxide. The silicon dioxide is a thermally grown oxide, in some instances. In some embodiments, the gate dielectric is a high dielectric constant (high-k; HK) material. A high-k dielectric material has a dielectric constant higher than that of silicon dioxide. In some embodiments, the gate electrode includes polycrystalline-silicon (poly-Si), poly-crystalline silicon-germanium (poly-SiGe), metallic nitride, metallic silicide, metallic oxide, metal, and/or other suitable layers. The formation of the gate electrode includes a deposition process and a subsequent etch process. In some embodiments, dummy structures 212, 214A and 214B further include a hard mask layer over the gate electrode. In some embodiments, dummy structures 212, 214A and 214B are formed in a gate-first methodology or a hybrid process of gate-last and gate-first methodologies.

Spacers 216 are along sidewalls of dummy structures 212, 214A and 214B. Spacers 216 include a dielectric material such as silicon oxide, silicon nitride, silicon oxynitride, silicon carbide, or combinations thereof. The formation of spacers 216 includes a procedure including deposition and etch back processes, in some instances. In various embodiments, spacers 216 are patterned by performing an isotropic or an anisotropic etch process to form D-shaped, I-shaped, or L-shaped spacers.

Returning to FIG. 1, method 100 continues with operation 120 in which an inter-layer dielectric (ILD) is deposited over the dummy structure and the spacers. In some embodiments, an etch stop layer, such as a contact etch stop layer (CESL), is deposited over the dummy structures and the spacers prior to depositing the ILD. The etch stop layer includes silicon oxide, silicon nitride, silicon oxynitride, silicon carbide, silicon oxycarbide, or another suitable material. In some embodiments, the formation of the etch stop layer includes a deposition process and then an etch back process. The etch stop layer is deposited by CVD, high density plasma CVD (HDP-CVD), spin-on coating, physical vapor deposition (PVD), atomic layer deposition (ALD), and/or other suitable method. Afterward, for example, the ILD is deposited by CVD, PVD, high density plasma (HDP), spin-on-dielectric (SOD) process, other suitable processes, and/or combination thereof. In some embodiments, the deposition process is followed by a planarization process, such as a chemical mechanical polishing (CMP) process, an etch process, or another suitable process.

Figure 2C:
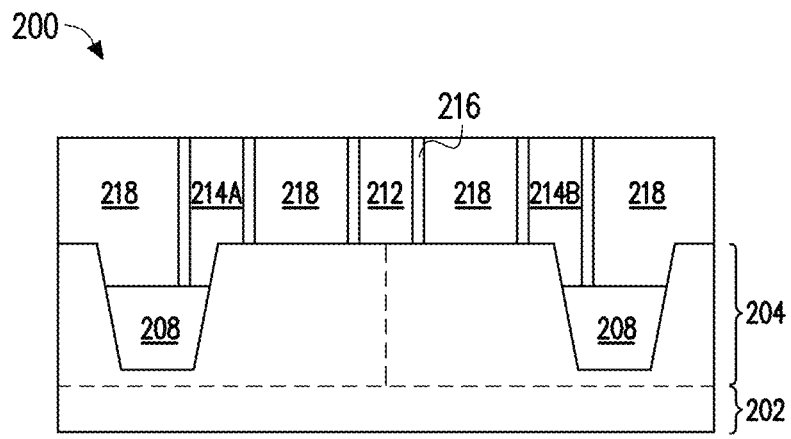

FIG. 2C is a cross-sectional view of semiconductor device 200 following operation 120 in accordance with one or more embodiments. After an etch stop layer (not shown) is formed over dummy structures 212, 214A and 214B, and spacers 216, an inter-layer dielectric (ILD) 218 is deposited over the etch stop layer. In some embodiments, ILD 218 includes an insulating material such as silicon oxide, silicon nitride, undoped silicate glass (USG), Boro-Silicate Glass (BSG), a low-k dielectric material, TEOS, other suitable materials, and/or combination thereof. In some embodiments, ILD 218 is planarized to be coplanar with a top surface of dummy gate structures 212, 214A and 214B. For example, ILD 218 is planarized by using a chemical mechanical planarization (CMP) to remove portions of ILD 218 over dummy structures 212, 214A and 214B as well as other dummy gate structures in circuit area 22. In some embodiments, the CMP is applied to remove the etch stop layer above the dummy structures 212, 214A and 214B to expose the gate electrode or a hard mask layer over the gate electrode. In some embodiments, the CMP is used to remove hard mask layer on the gate electrode. In various embodiments, other planarization techniques are used, such as an etch process.

Returning to FIG. 1, method 100 continues with operation 130 in which the dummy material is removed from the semiconductor strip. In some embodiments, the dummy material is a common dummy polysilicon between a first active region and a second active region. The dummy material of the dummy structure is removed using a photolithography process and an etch process. During the photolithography process, the dummy structure corresponding to the CPODE pattern is exposed while the other dummy structures or gate structures are protected by a mask layer. In some instances, the dummy structures corresponding to the PODE pattern are exposed at the same time with the CPODE pattern. The etch process is performed to remove the gate dielectric and gate electrode to expose the top surface of the semiconductor strip or substrate. In some embodiments, the removal process is conducted using the same process as removing the active gate electrodes in circuit area 22. In some embodiments, removing the dummy material comprises replacing dummy structures, other than the dummy structures corresponding to CPODE or PODE patterns, with active gate structures in a gate-last methodology.

A gate replacement process is then performed at the same process with active gate electrodes in circuit area 22. In some embodiments, the openings are filled with one or more layers. For example, a first dielectric layer is formed by using a thermal oxidation process. The first dielectric layer is formed by a deposition process, in some instances. In some embodiments, a second dielectric layer is formed on the first dielectric layer. The second dielectric layer includes a high-k dielectric material, in some instances. In some embodiments, the second dielectric layer has a U-shape or a rectangular shape. In some embodiments, a conductive layer is located within a cavity defined by the second dielectric layer. The conductive layer is disposed directly on the first dielectric layer, in some instances. In at least one embodiment, the conductive layer is tungsten. In some embodiments, the conductive layer includes different materials such as titanium, nickel, or tantalum, and has a work function suitable for a p-type device or an n-type device. After the gate replacement process, dummy structures 214A and 214B are formed as inactive gate structures 220A and 220B.

Method 100 continues with operation 140 in which a portion of the semiconductor strip under the dummy structure is removed to form a trench. In some embodiments, a trench is formed by removing a portion of the substrate under the dummy structure when the substrate is free of the semiconductor strip, i.e., the substrate has a planar top surface. The dummy structure and the portion of the semiconductor strip underneath are removed using one or multiple etch processes. In some embodiments, a removal process used to remove the dummy structure in operation 130 and a removal process used to remove a portion of the semiconductor strip in operation 140 is a continuous removal process. In some embodiments, the removal process used to remove the dummy structure in operation 130 and the removal process used to remove the portion of the semiconductor strip in operation 140 are separate removal processes. The trench corresponds to the CPODE pattern. In some embodiments, the trench separates the two abutted active regions. In some embodiments, the trench is between two abutted standard cells. The trench extends through at least the abutted two well regions of the two abutted active regions, i.e., a bottom surface of the trench is below a bottom surface of the abutted two well regions. The formation of the trench includes an etch process. During the etch process, at least a portion of the substrate is removed to define a trench between the neighboring active regions. In some embodiments, such etch process is called over-etching.

Figure 2D:
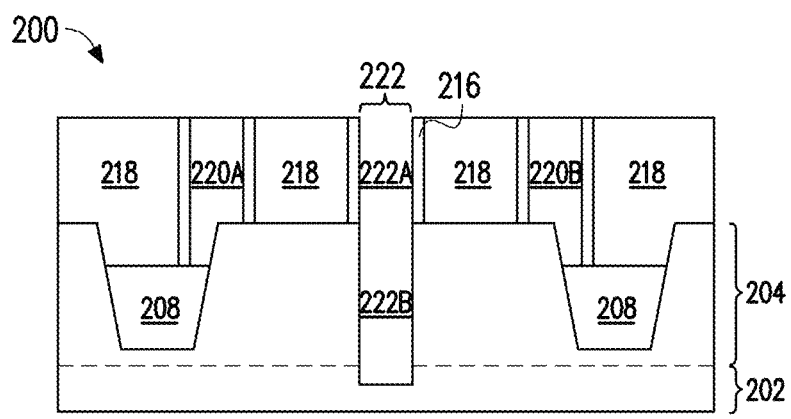

FIG. 2D is a cross-sectional view of semiconductor device 200 following operation 140 in accordance with one or more embodiments. FIG. 2D is a cross-sectional view during a gate-last process in which dummy structures 214A and 214B are removed to be replaced by inactive gate structures 220A and 220B. The gate electrode and gate dielectric are removed from dummy structures 214A and 214B, resulting in openings (not shown) in ILD 218. The openings are between spacers 216. Removal of the gate electrode and gate dielectrics from dummy structures 214A and 214B includes a photolithography process and an etch process. The etch process includes a wet etching by using a solution such as $NH_4OH$, dilute HF, and/or other suitable etchant, or a dry etching by using a gas such as fluorine-based and/or chlorine-based etchants. In some embodiments, the gate dielectric remains in the openings and only the gate electrode is removed. For example, the gate dielectric is a high-k dielectric material such as $HfO_2$, $TiO_2$, HfZrO, $Ta_2O_3$, $HfSiO_4$, $ZrO_2$, $ZrSiO_2$, and/or other suitable materials. In at least one embodiment, the gate dielectric is subsequently removed from the openings by using a buffered oxide etchant (BOE) after the removal of the gate electrode.

A trench 222 includes an upper portion 222A and a lower portion 222B. Upper portion 222A is above the top surface of semiconductor strip 204 and lower portion 222B is below the top surface of semiconductor strip 204. Upper portion 222A is similar to the openings formed by removing dummy structures 214A and 214B. In some embodiments, upper portion 222A is formed simultaneously with the formation of the openings formed by removing dummy structures 214A and 214B. In some embodiments, dummy structures 214A and 214B are not removed. In some embodiments, upper portion 222A is formed sequentially with the formation of the openings formed by removing dummy structures 214A and 214B. Lower portion 222B is aligned with upper portion 222A. In some embodiments, upper portion 222A and lower portion 222B are formed by a single etch process. In some embodiments, upper portion 222A and lower portion 222B are formed by multiple etch processes. For example, upper portion 222A is removed by the same procedure as the openings formed by dummy structures 214A and 214B and lower portion 222B is removed by a subsequent dry etching with a plasma source and an etchant gas. In some embodiments, the plasma source is an inductively coupled plasma (ICP), a transformer coupled plasma (TCP), an electron cyclotron resonance (ECR), a reactive ion etch (RIE), and/or other suitable techniques. In at least one embodiment, trench 222 separates one active region into two active regions. To reduce or prevent a leakage current between two active regions, trench 222 extends to a depth equal to or greater than a depth of well regions.

Returning again to FIG. 1, method 100 continues with operation 150 in which the trench is filled with a dielectric material to form a dielectric structure. In some embodiments, the trench is filled with more than one dielectric material. The dielectric structure has a width substantially equal to a gate length of other non-functioning edge dummy structures or functioning gate electrodes. The formation of the dielectric structure includes a deposition process. In some embodiments, a planarization or etching process is used to remove excess material deposited during the formation of the dielectric material.

Figure 2E:
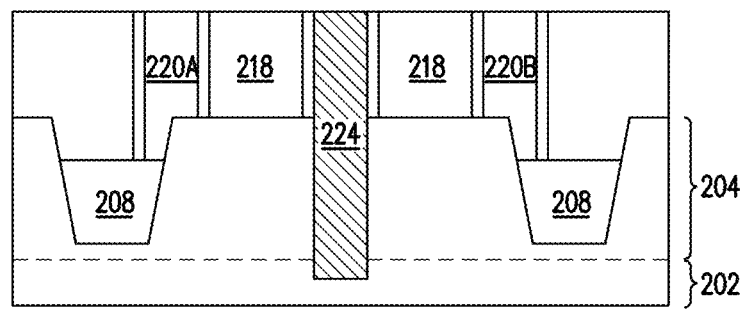

FIG. 2E is a cross-sectional view of semiconductor device 200 following operation 150 in accordance with one or more embodiments. Trench 222 is filled with a dielectric material to form a dielectric structure 224. In some embodiments, the dielectric material is silicon nitride. In some embodiments, the dielectric material is silicon carbide. In some embodiments, the dielectric material is a high-k dielectric material. A top surface of dielectric structure 224 is substantially coplanar with a top surface of edge dummy structures 220A and 220B, or is substantially coplanar with a top surface of active gate electrodes in circuit area 22. In some embodiments, the top surface of dielectric structure 224 is higher than the top surface of active gate electrodes. In some embodiments, a width of dielectric structure 224 is substantially the same as the gate length of at least one of edge dummy structures 220A and 220B or other active gate electrodes. The width of dielectric structure 224 ranges from about 40 Angstroms (Å) to about 200 Å depending on a process node of semiconductor device 200. For example, the width of dielectric structure 224 ranges from about 60 Å to about 100 Å. If the width of dielectric structure 224 is too thick, seal ring area 24 will increase, in some instances. In some embodiments, dielectric structure 224 includes multiple structures. For example, dielectric structure 224 includes an oxide-nitride-oxide structure (ONO). In some embodiments, upper portion 222A of trench 222 is filled with one dielectric material, and lower portion 222B of trench 222 is filled with a different dielectric material. Dielectric structure 224 is formed by using a deposition process such as CVD, PVD, ALD, other suitable processes, or combinations thereof. In some embodiments, a first formation process is used to fill upper portion 222A and a different formation process is used to fill lower portion 222B. In some embodiments, one or more dielectric structures are formed between edge dummy structures 220A and 220B. In some embodiments, dummy structures 214A and 214B are able to be replaced after the formation of the dielectric structure 224.

In comparison with other approaches which do not use a dielectric material to form a seal ring structure, dielectric structure 224 cuts a noise path and decreases a coupling effect. In addition, in comparison with other approaches which do not use a CPODE layer to form the seal ring structure, dielectric structure 224 reduces a manufacturing cost because additional photo masks and manufacturing processes are omitted by forming dielectric structure 224 along with the formation of transistors or capacitors. Meanwhile, because dielectric structure 224 is within trench 222, a risk of misalignment is reduced or completely avoided during the fabrication of dielectric structure 224, in comparison with other devices formed using different methods.

Returning to FIG. 1, method 100 continues with operation 160 in which an inter-metal dielectric (IMD) layer is stacked over the dielectric structure. The IMD layer extends from an IMD layer in circuit area 22. In some embodiments, a second etch stop layer is deposited over the ILD and an interface layer is deposited over the second etch stop layer. The second etch stop layer includes silicon nitride, silicon oxynitride, silicon carbide, silicon oxycarbide, or other suitable materials. The formation of the second etch stop layer includes a deposition process by CVD, sputtering, or other suitable process. The IMD layer includes a low-k dielectric material, which usually has a dielectric constant lower than 3, or extreme low-k (ELK) dielectric material, which usually has a dielectric constant lower than 2.6. In some embodiments, a hard mask layer or a contact feature is formed between the dielectric structure and the second etch stop layer. The IMD layer is formed over the interface layer. In some embodiments, the IMD layer is made of a same dielectric material or a different dielectric material from the ILD. The second etch stop layer has a different etch selectivity from the IMD layer.

In operation 170 an extending seal ring element is formed in the IMD layer. Operation 160 and operation 170 are performed in an iterative manner until the completion of IC process in circuit area 22. The extending seal ring element includes a horizontally extending seal ring (HESR) element and a vertically extending seal ring (VESR) element. The HESR element corresponds to a metal line of an interconnect element in circuit area 22 and the VESR element corresponds to a via plug of the interconnect element in circuit area 22. The extending seal ring element is made of a conductive material or a non-conductive material. When the extending seal ring is made of a conductive material, the formation of the material includes a typical BEoL process similar to the metal lines and via plugs in circuit area 22. When the extending seal ring is made of a non-conductive material, the formation of the material includes a photolithography process, an etch process and a deposition process. To distinguish from IMD layers, the non-conductive material is also called a sub-dielectric structure, in some embodiments.

Figure 2F:
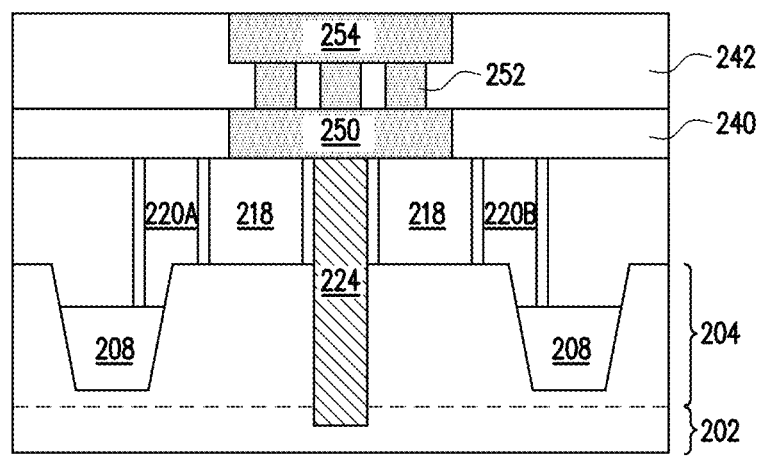

FIG. 2F is a cross-sectional view of semiconductor device 200 following operation 170 in accordance with one or more embodiments. A first IMD layer 240 is deposited over dielectric structure 224 and ILD 218. A first HESR element 250 is formed in first IMD layer 240. First HESR element 250 is formed of a conductive material using a single damascene process. In some embodiments, first HESR element 250 is formed along with an underlying conductive feature using a dual damascene process. Each metal structure of the plurality of metal structures and each via structure of a plurality of via structures includes at least one of copper, copper alloy, tungsten, aluminum, gold or another suitable material.

A second IMD layer 242 is deposited over first IMD layer 240 and first HESR element 250 after the formation of first HESR element 250. A first VESR element 252 and a second HESR element 254 are formed in second IMD layer 242. In some embodiments, a plurality of first VESR elements 252 is formed in second IMD layer 242. First VESR element 252 and second HESR element 254 are formed of a conductive material using a damascene process. Each metal structure of the plurality of metal structures and each via structure of a plurality of via structures includes at least one of copper, copper alloy, tungsten, aluminum, gold or another suitable material. Forming a HESR element or a VESR element at a position closer to a substrate with a non-conductive material will have a more significant impact on the coupling effect. In some embodiments, the HESR element closest to the substrate, i.e., HESR element in the M0 layer, is formed with the non-conductive material. In some embodiments, the VESR element closest to the substrate, i.e., the VESR element in the V0 layer, is formed with the non-conductive material. In some embodiments, at least one of first HESR element 250, first VESR element 252 or second HESR element 254 is made of a non-conductive material such as silicon nitride. For example, in some embodiments, first HESR element 250 is non-conductive; first VESR element 252 is non-conductive; and second HESR element 254 is conductive. In some embodiments, semiconductor device 200 further includes a plurality of HESR elements and a plurality of VESR elements in an alternating fashion. In some embodiments, a photomask is applied to protect seal ring area 24 from during a processing of circuit area 22. In some embodiments, a photomask is applied to protect circuit area 22 during processing of seal ring area 24. In some embodiments, a same photomask is used to process seal ring area 24 simultaneously with processing of circuit area 22. Reducing a number of masks used in a process helps to reduce manufacturing costs.

In some embodiments, a first hard mask layer over circuit area 22 is formed by a photolithography process. In some embodiments, the first hard mask layer is a patterned photoresist layer. In seal ring area 24, a trench opening for first HESR element 250 is formed by etching through first IMD layer 240. In some embodiments, the trench opening is formed by a plasma assisted process, such as a reactive ion etching (RIE) process. In some embodiments, an etch stop layer (not shown) is formed under first IMD layer 240 and over ILD 218. The etch stop layer has a high etch selectivity with respect to first IMD layer 240 and includes silicon nitride, silicon carbide, or silicon oxynitride, in some embodiments. The dielectric material, such as silicon nitride, is deposited in the trench opening to form first HESR element 250. In some embodiments, the deposition process includes chemical vapor deposition (CVD), physical vapor deposition (PVD), high density plasma (HDP) deposition, spin-on deposition (SOD), other suitable processes, and/or combination thereof. The first hard mask layer is removed from circuit area 22 and a metal structure is formed in circuit area 22 by a photolithography process, an etching process and a formation process, such as plating, PVD, sputtering or another suitable process. In some embodiments, a seed layer and the conductive material, such as copper, are formed until a top surface of the conductive material is above a top surface of first IMD layer 240. In some embodiments, a diffusion barrier layer is formed between the seed layer and the conductive material. The diffusion barrier layer includes titanium, titanium nitride, tantalum, tantalum nitride, and combinations thereof, in some embodiments. In some embodiments, a CMP process is performed to remove excess portions of the conductive material over first IMD layer 240 following formation of the conductive material. Alternatively, the order of the formation of first HESR element 250 and the formation of the conductive material in circuit area 22 is reversible.

In some embodiments, a second hard mask layer over circuit area 22 is defined by a photolithography process. Similar to a dual damascene process, first VESR element 252 and second HESR element 254 are formed by a trench-first or a via-first methodology. In some embodiments, a first opening for first VESR element 252 is formed through second IMD layer 242. The first opening is formed by a plasma assisted process, such as the RIE process, in some embodiments. In some embodiments, an etch stop layer is between second IMD layer 242 and first IMD layer 240. The etch stop layer has a high etch selectivity with respect to first IMD layer 240 and includes silicon nitride, silicon carbide, or silicon oxynitride, in some embodiments. A second opening for second HESR element 254 is formed by etching second IMD layer 242. The etching process includes an RIE process and stops on an upper portion of second IMD layer 242, in some embodiments. The second opening overlaps an entirety of the first opening and a bottom surface of the second opening is over a bottom surface of the first opening. In some embodiments, the second opening is also called a trench. In some embodiments, the second opening overlaps and encompasses multiple first openings. The dielectric material is deposited and to fill the first opening and the second opening to form first VESR element 252 and second HESR element 254. Similar to first HESR element 250, the deposition process of first VESR element 252 and second HESR element 254 includes CVD, PVD, HDP, SOD, other suitable processes, and/or combination thereof. The second hard mask layer is removed from circuit area 22 and a via plug and a metal structure are formed in circuit area 22 by the dual damascene process. Alternatively, the order of the formation of first VESR element 252 and second HESR 254, and the formation of the conductive material in circuit area 22 is reversible.

Figure 3:
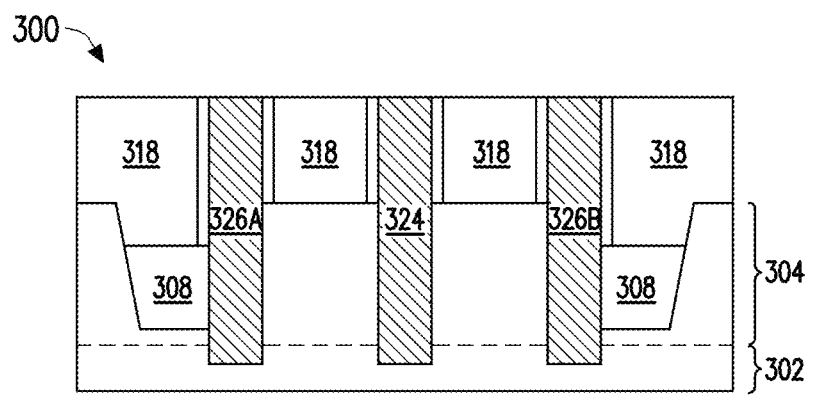
FIGS. 3-8 are cross-sectional views of a semiconductor device in accordance with one or more embodiments.

FIG. 3 is a schematic diagram of a semiconductor device 300 in accordance with one or more embodiments. Semiconductor device 300 is similar to semiconductor device 200, like elements have a same reference number increased by 100. Semiconductor device 300 includes a first dielectric structure 326A, a second dielectric structure 326B, and a third dielectric structure 324. First dielectric structure 326A and second dielectric structure 326B correspond to the PODE pattern, while third dielectric structure 324 corresponds to the CPODE pattern. In either first dielectric structure 326A or second dielectric structure 326B, a portion of semiconductor strip 304 and a portion of insulating feature 308 underneath are removed. In some embodiments, first dielectric structure 326A, second dielectric structure 326B, and third dielectric structure 324 are made of a same dielectric material, for example, silicon nitride. In some embodiments, at least one of first dielectric structure 326A or second dielectric structure 326B is made with a different dielectric material from third dielectric structure 324. Bottom surfaces of first dielectric structure 326A, second dielectric structure 326B and third dielectric structure 324 are coplanar to each other. In some embodiments, the bottom surfaces of first dielectric structure 326A, second dielectric structure 326B and third dielectric structure 324 are not coplanar.

Figure 4:
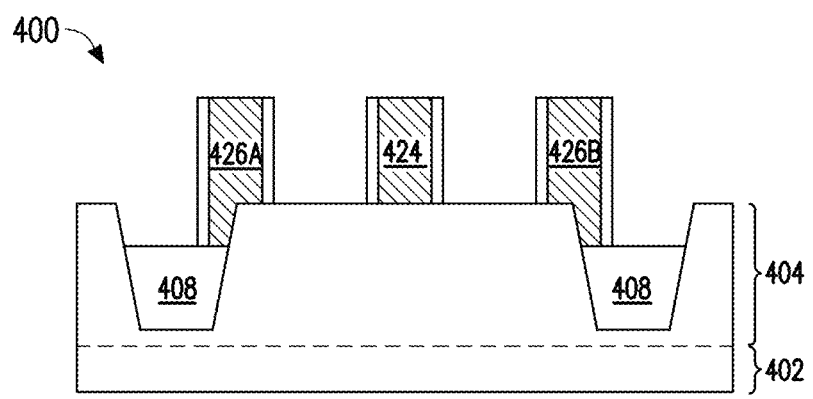

FIG. 4 is a schematic diagram of a semiconductor device 400 in accordance with one or more embodiments. Semiconductor device 400 is similar to semiconductor device 300, like elements have a same reference number increased by 100. Semiconductor device 400 includes a first dielectric structure 426A, a second dielectric structure 426B, and a third dielectric structure 424. In comparison with first dielectric structure 326A, second dielectric structure 326B and third dielectric structure 324, third dielectric structure 424 is formed on a top surface of semiconductor strip 404, and first dielectric structure 426A and second dielectric structure 426B are partially formed on the top surface of semiconductor strip 404 and a top surface of insulating features 408. In comparison with semiconductor device 300, no trench extending into semiconductor strip 404 is formed in semiconductor device 400.

Figure 5:
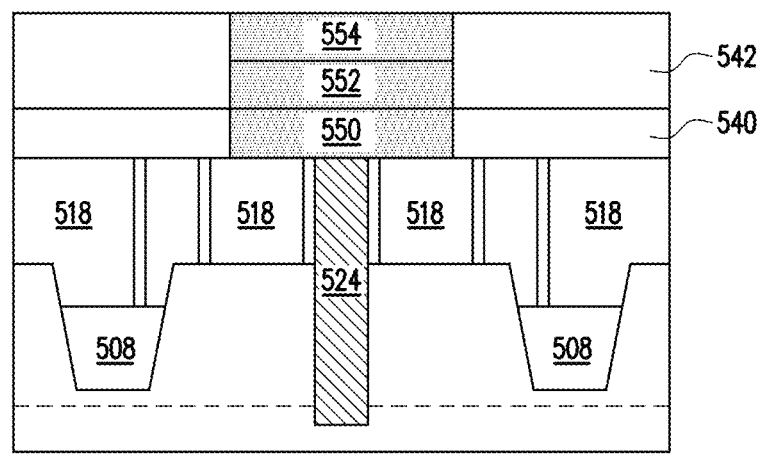

FIG. 5 is a schematic diagram of a semiconductor device 500 in accordance with one or more embodiments. Semiconductor device 500 is similar to semiconductor device 200, like elements have a same reference number increased by 300. Semiconductor device 500 includes a dielectric structure 524, a first HESR element 550 in a first IMD layer 540, and a first VESR element 552 and a second HESR element 554 in a second IMD layer 542. In comparison with first VESR element 252 in semiconductor device 200, first VESR element 552 has a continuous bar shape, forming a closed-loop seal ring extending along inner IC.

Semiconductor device 500 includes conductive materials for each of first HESR element 550, first VESR element 552, and second HESR element 554. In some embodiments, a material of at least one of first HESR element 550, first VESR element 552, or second HESR element 554 is replaced with a dielectric material, such as silicon nitride. In comparison with other approaches using conductive materials as HESR elements and VESR elements, silicon nitride helps to further isolate of seal ring, thereby reducing the coupling effect and enhancing the IC performance. In some embodiments, the dielectric material is a different material from a surrounding IMD layer.

Figure 6:
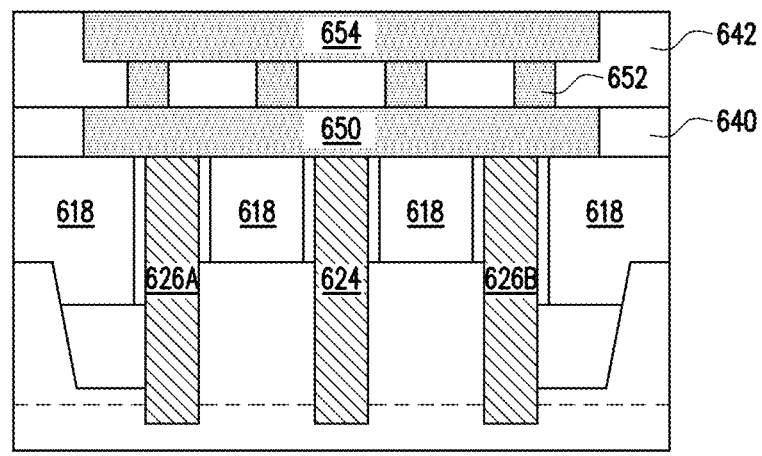

FIG. 6 is a schematic diagram of a semiconductor device 600 in accordance with one or more embodiments. Semiconductor device 600 is similar to semiconductor device 400, like elements have a same reference number increased by 200. Semiconductor device 600 includes a first dielectric structure 626A, a second dielectric structure 626B, a third dielectric structure 624, a first HESR element 650, a first VESR element 652, a second HESR element 654, a first IMD layer 640 and a second IMD layer 642. In comparison with first HESR element 450 in semiconductor device 400, first HESR element 650 contacts first structure 626A, second dielectric structure 626B and third dielectric structure 624. In some embodiments, first VESR element 652 has a continuous bar shape, lying on first HESR element 650 to form a closed-loop seal ring structure. In some embodiments, at least one of first HESR element 650, first VESR element 652 and second HESR element 654 is made of a dielectric material, for example, silicon nitride.

Semiconductor device 600 includes conductive materials for each of first HESR element 650, first VESR element 652, and second HESR element 654. In some embodiments, a material of at least one of first HESR element 650, first VESR element 652, or second HESR element 654 is replaced with a dielectric material, such as silicon nitride.

Figure 7:
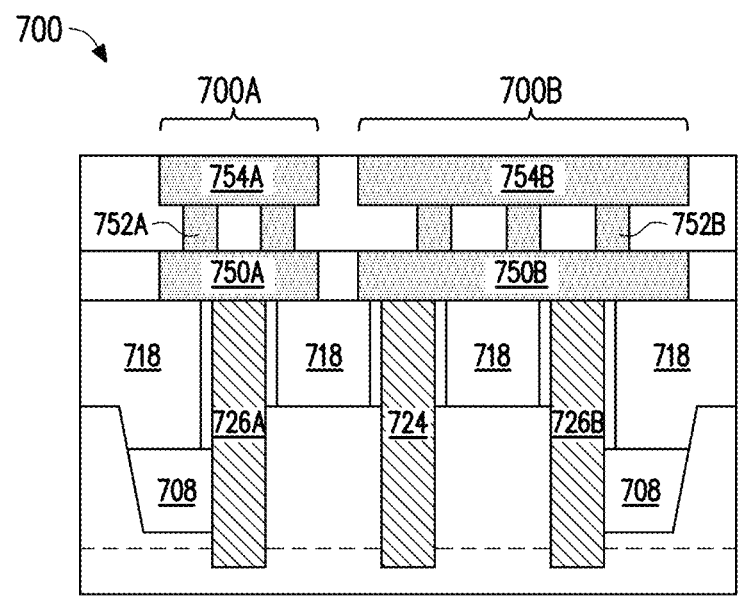

FIG. 7 is a schematic diagram of a semiconductor device 700 in accordance with one or more embodiments. Semiconductor device 700 is similar to semiconductor device 600, like elements have a same reference number increased by 100. Semiconductor device 700 includes a first dielectric structure 726A, a second dielectric structure 726B and a third dielectric structure 724. Semiconductor device 700 further has a first seal ring 700A and a second seal ring 700B. First seal ring 700A, for example, includes a first HESR element 750A, a first VESR element 752A and a second HESR element 754A. First HESR element 750A is on first dielectric structure 726A. Second seal ring 700B includes first HESR element 750B, first VESR element 752B and second HESR element 754B. First HESR element 750B contacts second dielectric structure 826B and third dielectric 824. In some embodiments, first VESR element 752A or 752B has a continuous bar shape lying on first HESR element 750A or first HESR element 750B. In some embodiments, first seal ring 700A is isolated from second seal ring 700B.

Semiconductor device 700 includes conductive materials for each of first HESR element 750, first VESR element 752, and second HESR element 754. In some embodiments, a material of at least one of first HESR element 750, first VESR element 752, or second HESR element 754 is replaced with a dielectric material, such as silicon nitride.

Figure 8:
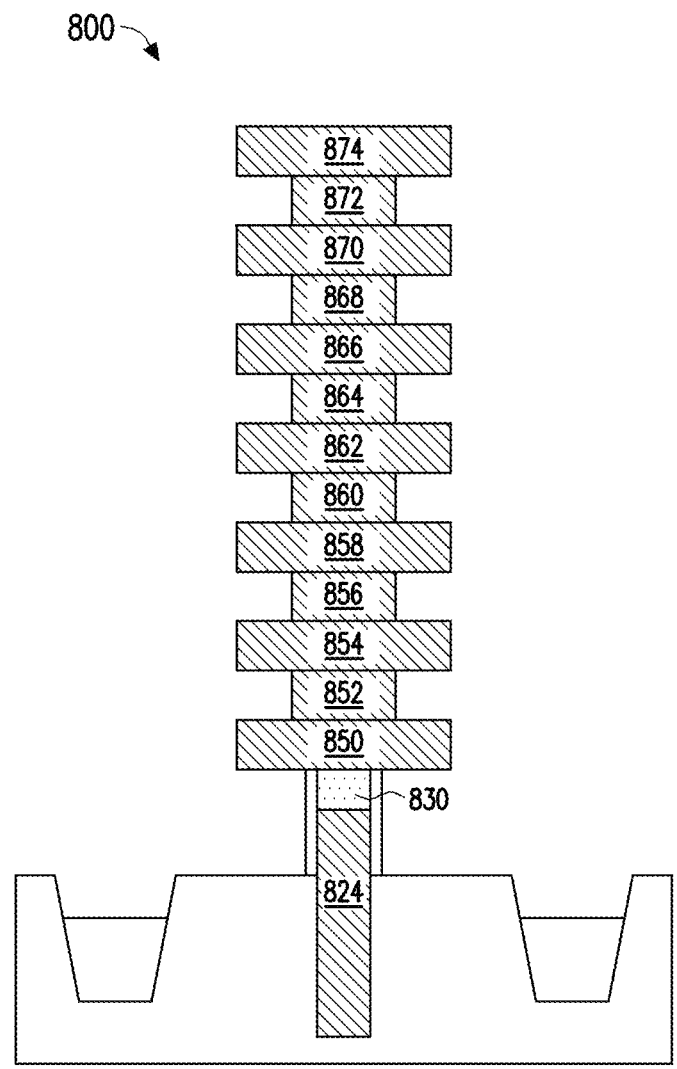

FIG. 8 is a schematic diagram of a semiconductor device 800 in accordance with one or more embodiments. Semiconductor device 800 is similar to semiconductor device 200, like elements have a same reference number increased by 700. Semiconductor device 800 is a typical 1P7M (one-poly-seven-metal) seal ring structure. In some embodiments, semiconductor device 800 has other interconnection schemes, such as 1P8M or 2P5M, or other suitable arrangements. Semiconductor device 800 includes a dielectric structure 824, a contact feature or hard mask 830, a plurality of HESR elements 850/854/858/862/866/870/874 and a plurality of VESR elements 852/856/860/864/868/872. In some embodiments, at least one of the plurality of HESR elements 850/854/858/862/866/870/874 and the plurality of VESR elements 852/856/860/864/868/872 is made of a dielectric material. In some embodiments, only one of the plurality of HESR element 850/854/858/862/866/870/874 is made of a conductive material. A topmost HESR element 874 is ground, in some instances. In some embodiments, each HESR element of the plurality of HESR elements 850/854/858/862/866/870/874 and each VESR element of the plurality of VESR elements 852/856/860/864/868/872 are made of the dielectric material.

In some embodiments, at least one HESR of the plurality of HESR 850/854/858/862/866/870/874 or at least one VESR of the plurality of VESR elements 852/856/860/864/868/872 are formed by repeating the dual damascene process described above. In some embodiments, at least one HESR of the plurality of HESR 850/854/858/862/866/870/874 or at least one VESR of the plurality of VESR elements 852/856/860/864/868/872 are formed simultaneously after the topmost metal layer in circuit area 22. In some embodiments, a deep opening is formed by etching or drilling into IMD layers. The deep opening is then filled with the dielectric material. In some embodiments, the filling process includes PVD, CVD, HDP deposition, SOD or another suitable process. The dielectric material outside of the deep opening is planarized to remove excess dielectric material. Using the deep opening process avoids the use of a different mask for forming of elements in circuit area 22 and seal ring area 24; and therefore, helps to reduce manufacturing costs in comparison with other techniques.

Semiconductor device 800 includes conductive materials for each of first HESR element 850, first VESR element 852, and second HESR element 854. In some embodiments, a material of at least one of first HESR element 850, first VESR element 852, or second HESR element 854 is replaced with a dielectric material, such as silicon nitride.

Semiconductor devices 200-800 may undergo further processes to complete fabrication. For example, a first passivation layer is formed on a topmost IMD layer and a second passivation layer is formed on the first passivation layer. In some embodiments, the first passivation layer and the second passivation layer is formed oxides, nitrides, and combinations thereof. Semiconductor devices 200-800 further include an aluminum ring (alternatively referred to as aluminum pad or pad ring) over, and physically connected to a topmost metal layer. The aluminum ring may include a portion over the first passivation layer and a portion penetrating into the first passivation layer. The aluminum ring is formed simultaneously with the formation of bond pads (not shown) exposed on a top surface of semiconductor devices 200-800.

An aspect of this description relates to a method. The method includes forming parallel first and second dummy materials in an alternating manner. The method further includes etching portions of the first and second dummy materials, using respective selective etches, to form a plurality of gaps. The method further includes filling a first gap of the plurality of gaps with a dielectric material. The method further includes filling a second gap of the plurality of gaps with a conductive material. In some embodiments, etching the portion of the first dummy material includes etching the portion of the first dummy material prior to etching the portion of the second dummy material. In some embodiments, the method further includes masking the second dummy material during etching of the portion of the first dummy material. In some embodiments, filling the second gap includes filling the second gap with tungsten, titanium, nickel or tantalum. In some embodiments, filling the first gap includes filling the first gap with silicon nitride or silicon carbide. In some embodiments, the method further includes forming a diffusion barrier layer in the second gap prior to filling the second gap with the conductive material. In some embodiments, forming the diffusion barrier layer includes forming the diffusion barrier layer comprising titanium, titanium nitride, tantalum or tantalum nitride. In some embodiments, the method further includes forming spacers along sidewalls of the first and second dummy materials.

An aspect of this description relates to a method. The method includes forming parallel first and second dummy materials in an alternating manner. The method further includes etching portions of the first and second dummy materials, using respective selective etches, to form a plurality of gaps. The method further includes depositing a dielectric material into each of the plurality of gaps. The method further includes depositing a conductive material over the dielectric material in a first gap of the plurality of gaps. In some embodiments, etching the portion of the first dummy material includes etching the portion of the first dummy material prior to etching the portion of the second dummy material. In some embodiments, the method further includes masking the second dummy material during etching of the portion of the first dummy material. In some embodiments, etching portions of the first and second dummy materials includes exposing sidewalls of an underlying material in at least one gap of the plurality of gaps. In some embodiments, depositing the conductive material includes depositing tungsten, titanium, nickel or tantalum. In some embodiments, depositing the dielectric material includes depositing silicon nitride or silicon carbide. In some embodiments, the method further includes forming a diffusion barrier layer in the first gap prior to depositing the conductive material. In some embodiments, forming the diffusion barrier layer includes forming the diffusion barrier layer comprising titanium, titanium nitride, tantalum or tantalum nitride. In some embodiments, the method further includes forming spacers along sidewalls of the first and second dummy materials.

An aspect of this description relates to a method. The method includes forming a first plurality of dummy materials. The method further includes forming a second dummy material, wherein the second dummy material is between adjacent first dummy materials of the plurality of dummy materials. The method further includes etching the first plurality of dummy materials to form a plurality of trenches. The method further includes masking the second dummy material during the etching of the first plurality of dummy materials. The method further includes etching the second dummy material to form a gap. The method further includes filling the gap with a dielectric material. The method further includes filling the plurality of trenches with a conductive material. In some embodiments, the method further includes forming a diffusion barrier layer in each of the plurality of trenches prior to filling the plurality of trenches with the conductive material. In some embodiments, filling the gap includes filling the gap with silicon nitride or silicon carbide.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, operations, and steps described in the specification. As one of ordinary skill in the art will readily appreciate from the disclosure, processes, machines, manufacture, compositions of matter, means, methods, operations, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, operations, or steps. In addition, each claim constitutes a separate embodiment, and the combination of various claims and embodiments are within the scope of the disclosure.

What is claimed is:

1. A method comprising:
    forming parallel first and second dummy materials in an alternating manner on a substrate;
    etching of the first and second dummy materials, using respective selective etches, to form a plurality of gaps;
    filling a first gap of the plurality of gaps with a dielectric material; and
    filling a second gap of the plurality of gaps with a conductive material, wherein the conductive material extends below a top surface of the substrate.

2. The method of claim 1, wherein etching the first dummy material comprises etching the first dummy material prior to etching the portion of the second dummy material.

3. The method of claim 1, further comprising masking the second dummy material during etching of the first dummy material.

4. The method of claim 1, wherein filling the second gap comprises filling the second gap with tungsten, titanium, nickel or tantalum.

5. The method of claim 1, wherein filling the first gap comprises filling the first gap with silicon nitride or silicon carbide.

6. The method of claim 1, further comprising forming a diffusion barrier layer in the second gap prior to filling the second gap with the conductive material.

7. The method of claim 6, wherein forming the diffusion barrier layer comprises forming the diffusion barrier layer comprising titanium, titanium nitride, tantalum or tantalum nitride.

8. The method of claim 1, further comprising forming spacers along sidewalls of the first and second dummy materials.

9. A method comprising:
    forming parallel first and second dummy materials over a substrate in an alternating manner, wherein the second dummy material is between adjacent first dummy materials in a direction parallel to a top surface of the substrate;
    etching of the first and second dummy materials, using respective selective etches, to form a plurality of gaps;
    depositing a dielectric material into at least one of the plurality of gaps; and
    depositing a conductive material over the dielectric material in a first gap of the plurality of gaps.

10. The method of claim 9, wherein etching the first dummy material comprises etching the first dummy material prior to etching the portion of the second dummy material.

11. The method of claim 9, further comprising masking the second dummy material during etching of the first dummy material.

12. The method of claim 9, wherein etching the first and second dummy materials comprises exposing sidewalls of an underlying material in at least one gap of the plurality of gaps.

13. The method of claim 9, wherein depositing the conductive material comprises depositing tungsten, titanium, nickel or tantalum.

14. The method of claim 9, wherein depositing the dielectric material comprises depositing silicon nitride or silicon carbide.

15. The method of claim 9, further comprising forming a diffusion barrier layer in the first gap prior to depositing the conductive material.

16. The method of claim 15, wherein forming the diffusion barrier layer comprises forming the diffusion barrier layer comprising titanium, titanium nitride, tantalum or tantalum nitride.

17. The method of claim 9, further comprising forming spacers along sidewalls of the first and second dummy materials.

18. A method comprising:
    forming a first plurality of dummy materials;
    forming a second dummy material, wherein the second dummy material is between adjacent first dummy materials of the plurality of dummy materials;
    etching the first plurality of dummy materials to form a plurality of trenches;
    masking the second dummy material during the etching of the first plurality of dummy materials;
    etching the second dummy material to form a gap;
    filling the gap with a dielectric material; and
    filling the plurality of trenches with a conductive material.

19. The method of claim 18, further comprising forming a diffusion barrier layer in each of the plurality of trenches prior to filling the plurality of trenches with the conductive material.

20. The method of claim 18, wherein filling the gap comprises filling the gap with silicon nitride or silicon carbide.

* * * * *